US010129640B2

(12) United States Patent
Lee et al.

(10) Patent No.: US 10,129,640 B2
(45) Date of Patent: Nov. 13, 2018

(54) SUPPRESSING A MODAL FREQUENCY OF A LOUDSPEAKER

(71) Applicant: Hewlett-Packard Development Company, L.P., Houston, TX (US)

(72) Inventors: Victor Lee, Sunnyvale, CA (US); Bowon Lee, Mountain View, CA (US)

(73) Assignee: Hewlett-Packard Development Company, L.P., Houston, TX (US)

(*) Notice: Subject to any disclaimer, the term of this patent is extended or adjusted under 35 U.S.C. 154(b) by 0 days.

(21) Appl. No.: 15/116,090

(22) PCT Filed: Feb. 6, 2014

(86) PCT No.: PCT/US2014/015154
§ 371 (c)(1),
(2) Date: Aug. 2, 2016

(87) PCT Pub. No.: WO2015/119612
PCT Pub. Date: Aug. 13, 2015

(65) Prior Publication Data
US 2017/0180855 A1 Jun. 22, 2017

(51) Int. Cl.
*H03G 5/00* (2006.01)
*H04R 3/04* (2006.01)
*H04R 1/24* (2006.01)
*H04R 7/04* (2006.01)

(52) U.S. Cl.
CPC ................ *H04R 3/04* (2013.01); *H04R 1/24* (2013.01); *H04R 7/04* (2013.01)

(58) Field of Classification Search
CPC .............. H04R 3/04; H04R 1/24; H04R 7/04
See application file for complete search history.

(56) References Cited

U.S. PATENT DOCUMENTS 5,793,877 A 8/1998 Tagg
6,389,935 B1 5/2002 Azima
6,804,367 B2 * 10/2004 Asada ..................... H04R 5/02 381/152
7,038,356 B2 5/2006 Athanas
7,302,068 B2 11/2007 Longbottom et al.
8,391,540 B2 3/2013 Berriman et al.
8,542,840 B2 9/2013 Manninger et al.
8,565,441 B2 10/2013 Kim
(Continued)

FOREIGN PATENT DOCUMENTS

CN 202841503 U 3/2013
JP 2007-240704 A 9/2007

OTHER PUBLICATIONS

Julius O. Smith III, "Comb Filters," 2010, 1-page, Center for Computer Research in Music and Acoustics, Available at: <ccrma.stanford.edu/~jos/pasp/Comb_Filters.html>.
(Continued)

*Primary Examiner* — Andrew L Sniezek
(74) *Attorney, Agent, or Firm* — HP Inc. Patent Department

(57) ABSTRACT

An example provides an apparatus to receive an audio input signal, generate, from the audio input signal, a filtered audio input signal to suppress at least one modal frequency of a flat loudspeaker diaphragm, and output the filtered audio input signal to at least one actuator to cause a vibration of the flat loudspeaker diaphragm.

19 Claims, 4 Drawing Sheets

(56) References Cited

U.S. PATENT DOCUMENTS

| | | | | |
|---|---|---|---|---|
| 2001/0022835 | A1* | 9/2001 | Matsu | H04R 1/403 379/1.01 |
| 2002/0067841 | A1 | 6/2002 | Bank | |
| 2004/0189151 | A1 | 9/2004 | Athanas et al. | |
| 2006/0029240 | A1 | 2/2006 | Bank | |
| 2008/0285768 | A1 | 11/2008 | Larsen et al. | |
| 2010/0111351 | A1* | 5/2010 | Berkhoff | H04R 7/045 381/396 |
| 2010/0215193 | A1 | 8/2010 | Wihardja et al. | |
| 2011/0051937 | A1 | 3/2011 | Ma et al. | |
| 2012/0008812 | A1 | 1/2012 | Sporer et al. | |

OTHER PUBLICATIONS

M.R. Safizadeh et al., "Calculating the Frequency Modes of Flexible Square Plate Using Finite Element and Finite Difference Methods," ICIAS, 2010, pp. 1-4.

Russell., "Vibrational Modes of a Rectangular Membrane," 2004-2011, 1-page, <acs.psu.edu/drussell/Demos/MembraneSquare/Square.html>.

Tobias Corbach et al., "Controlling Double Dipole Loudspeaker Radiation by Adapted Input Filtering," ISCCSP 2010, Mar. 3-5, 2010, pp. 1-4, IEEE.

* cited by examiner

SUPPRESSING A MODAL FREQUENCY OF A LOUDSPEAKER

BACKGROUND

Loudspeakers produce sound in response to electrical audio signal inputs. One type of loudspeaker is the flat panel loudspeaker, which may include a flat surface working as a loudspeaker diaphragm that may be driven by a multitude of electromechanical actuators. The actuators may be designed to convert the audio signal inputs to back and forth movement In some instances, the loudspeaker diaphragm driven by the actuators may create vibrational modes, each of which may be associated with a specific modal frequency. If the loudspeaker diaphragm is excited by audio signal inputs containing any one of these modal frequencies a resonance or ringing may occur.

BRIEF DESCRIPTION OF THE DRAWINGS

The detailed description section references the drawings, wherein.

Figure 1:
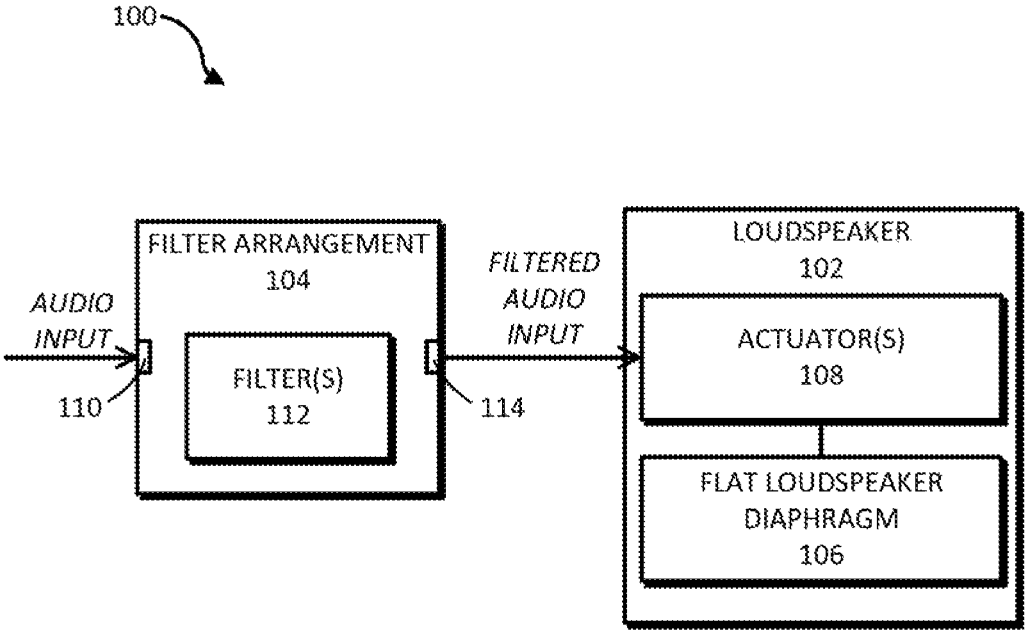
FIG. 1 is a block diagram of an example loudspeaker apparatus.

all in which various embodiments may be implemented.

Examples are shown in the drawings and described in detail below. The drawings are not necessarily to scale, and various features and views of the drawings may be shown exaggerated in scale or in schematic for clarity and/or conciseness. The same part numbers may designate the same or similar parts throughout the drawings.

DETAILED DESCRIPTION

A traditional loudspeaker may include a diaphragm and a driver. The driver may be an electromechanical actuator designed to convert electric current to back and forth movement. The driver may be attached to the center of the diaphragm to create sound pressure changes for generating sound. These loudspeakers commonly include a diaphragm that is cone-shaped and made of light and rigid material with low mechanical impedance to match that of air for efficient sound reproduction. The diaphragm of these loudspeakers typically move as one body, which may be possible because these diaphragms are rigid and light and mounted freely for vibration.

A flat panel loudspeaker, on the other hand, may include a flat surface working as a loudspeaker diaphragm that may be driven by a multitude of electromechanical actuators. Flat panel loudspeakers often use heavier or thicker material as the loudspeaker diaphragm and the actuators may be attached to specific locations of the diaphragm to apply back and forth movement to create sound pressure waves. Such actuators may be smaller in size and have higher mechanical impedance as compared with traditional loudspeaker drivers. In addition, it may be more difficult to make one body movement of the diaphragm because the diaphragm is heavier and its size with respect to the size of the actuator contact points may be much larger than conventional loudspeakers. Moreover, the edges of the loudspeaker diaphragm may have a rigid point of contact to the frame, which may create bending motion of the diaphragm to generate sound pressure changes. Depending on the shape, rigidity, and, density of the loudspeaker diaphragm of a flat panel loudspeaker, this bending motion may cause the loudspeaker diaphragm to experience numerous vibrational modes, created by locations of nodes and anti-nodes, when driven by its associated actuators. Exciting the loudspeaker diaphragm with audio input signals containing any of the modal frequencies may result in resonance or ringing, which may be detrimental to faithful sound reproduction.

Due to the limited availability of small and powerful actuators as well as the higher rigidity and thickness of typical materials used for flat loudspeaker diaphragms, some solutions have focused on utilizing modal frequencies as much as possible to generate loud sound rather than on controlling the modal frequencies to provide a flat frequency response. Though thin and rigid materials have become more available, which may allow small and low power actuators to easily drive flat loudspeaker diaphragms.

Even with the increasing availability of thin and rigid diaphragm materials, other solutions have addressed modal frequency control by using active/passive actuators at specific locations of the diaphragm belonging to specific nodes to prevent modal frequencies for a few modes. This solution, however, may be significantly limited in application scope at least due to the limited ability to place actuators at every node/anti-node location, as there may be numerous nodes/anti-nodes. Moreover, in the case of transparent loudspeaker diaphragms, it may be undesirable to place actuators in visible locations. For example, a glass loudspeaker diaphragm may be used for protecting the display and/or touch sensor underneath the diaphragm, and so it may be desirable to avoid placing actuators in most of the glass area.

Described herein are various implementations of suppressing modal frequencies of a flat panel loudspeaker. In various implementations, a filter arrangement may receive an audio input signal, generate, from the audio input signal, a filtered audio input signal to suppress at least one modal frequency of a flat loudspeaker diaphragm, and output the filtered audio input signal to at least one actuator coupled to the flat loudspeaker diaphragm to cause a vibration of the flat loudspeaker diaphragm. Suppressing or controlling modal frequencies may provide a flatter frequency response than would otherwise be possible, at least for the audible range, to allow resonance and ringing to be controlled.

FIG. 1 is a block diagram of an example loudspeaker apparatus 100 in accordance with various implementations. The loudspeaker apparatus 100 includes a loudspeaker 102 and a filter arrangement 104. The loudspeaker 102 may include a flat loudspeaker diaphragm 106 and at least one actuator 108 coupled to the flat loudspeaker diaphragm 106. The filter arrangement 104 may include at least one filter 112.

The loudspeaker apparatus 100 may be a stand-alone device or may be incorporated into any apparatus or system. Examples of such apparatuses or systems may include, but are not limited to, flat panel loudspeakers, desktop computers, notebook computers, handheld computers, tablet computers, netbook computers, convertible computers, display devices, digital recorders, game consoles, smart phones, personal digital assistants, mobile phones, digital media players, televisions, or digital cameras.

The flat loudspeaker diaphragm 106 may comprise any suitable material for forming a flat panel loudspeaker.

Examples of suitable materials for the flat loudspeaker diaphragm 106 may include, but are not limited to, glass, plastic, fiber, fabric, or another suitable material. In one implementation, the flat loudspeaker diaphragm 106 may comprise Gorilla Glass®, available from Corning Incorporated. In various implementations, the flat loudspeaker diaphragm 106 may be transparent or opaque. In various implementations, the flat loudspeaker diaphragm 106 may comprise a bendable or rigid planar, uncurved flat panel. In other implementations, the flat panel diaphragm 106 may comprise a bendable or rigid curved panel. In one example, the loudspeaker apparatus 100 may comprise a mobile device, such as, for example, a smart phone or handheld computer, with the flat loudspeaker diaphragm 106 comprising glass. The glass flat loudspeaker diaphragm 106 may protect the LCD or LED display and touch panels.

The actuator(s) 108 may comprise any suitable actuator for driving the flat loudspeaker diaphragm 106 by converting the filtered audio input signal(s) to back and forth movement of the flat loudspeaker diaphragm 106 to create sound pressure changes for generating sound. In various implementations, the actuator(s) 108 may comprise a plurality of actuators, each one of the plurality of actuators configured to cause a vibration of the flat loudspeaker diaphragm 106 at a frequency range different from frequency ranges of other ones of the plurality of actuators.

In various implementations, the filter arrangement 104 may include an input port 110 to receive an audio input signal (AUDIO INPUT) and at least one filter 112 to generate, from the audio input signal, a filtered audio input signal (FILTERED AUDIO INPUT) to suppress at least one modal frequency of the flat loudspeaker diaphragm 106. The filter arrangement 104 may include an output port 114 the filtered audio input signal to the at least one actuator 108 to cause a vibration of the flat loudspeaker diaphragm 106.

The filtered audio input may cause the vibrations of the flat loudspeaker diaphragm 106 may have a substantially flat frequency response. In various ones of these implementations, the flat frequency response may result in the loudspeaker 102 generating sound with less resonance and/or ringing than might be achieved with an apparatus not including the filter arrangement 104 or filter 112.

Figure 2:
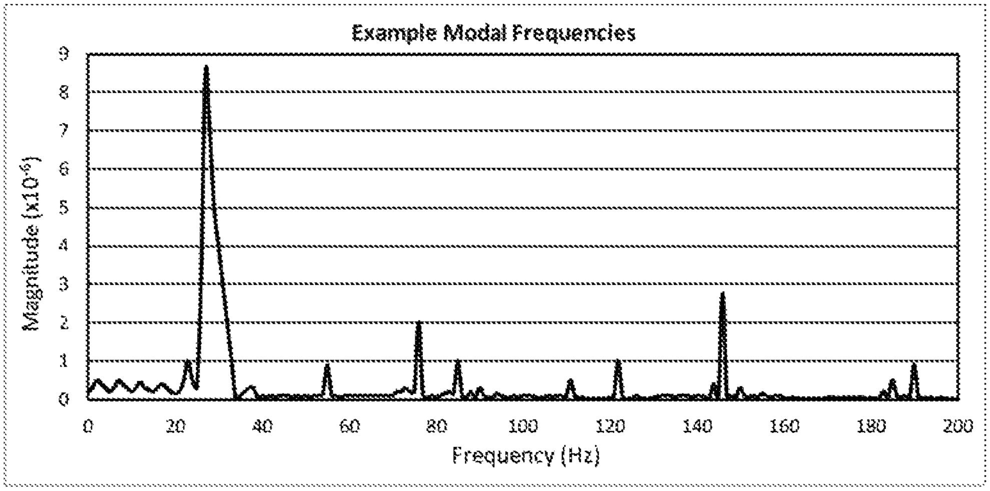
FIG. 2 depicts an example modal frequency response for a loudspeaker.

An example of a frequency response of an example loudspeaker of a loudspeaker apparatus without the filter arrangement 104 is depicted in FIG. 2. For this example, the loudspeaker diaphragm of the loudspeaker comprises a rectangular plate with a size of about 0.25 m×0.87 m. As shown, the frequency response caused by a plurality of vibrational modes of the diaphragm, with the modal frequencies represented by the sharp spikes. As noted herein, vibrational modes of a flat loudspeaker diaphragm may depend on the shape, rigidity, and/or density of the material of the diaphragm as well as the location of the nodes and the anti-nodes. Nodes may typically, but not always, be determined by the locations of the actuators. Anti-nodes may typically, but not always, be determined by the contact points between the flat loudspeaker diaphragm and the loudspeaker frame. If the frequency content of the audio input signal that drives the flat panel includes frequencies that match the frequencies of the vibrational modes, this may cause resonance, or ringing, of the, produced sound of the loudspeaker. In other words, the frequency content for these modal frequencies may be significantly boosted, making it difficult to reproduce sound with a fiat frequency response.

Figure 3:
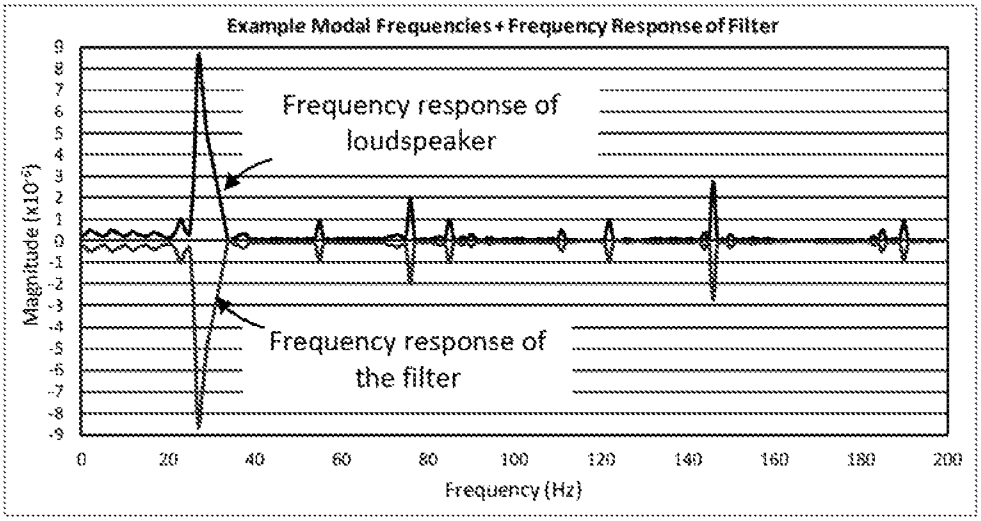
FIG. 3 depicts the modal frequency response of the loudspeaker of FIG. 2 with the frequency response of the filter to suppress the modal frequency response.
Figure 4:
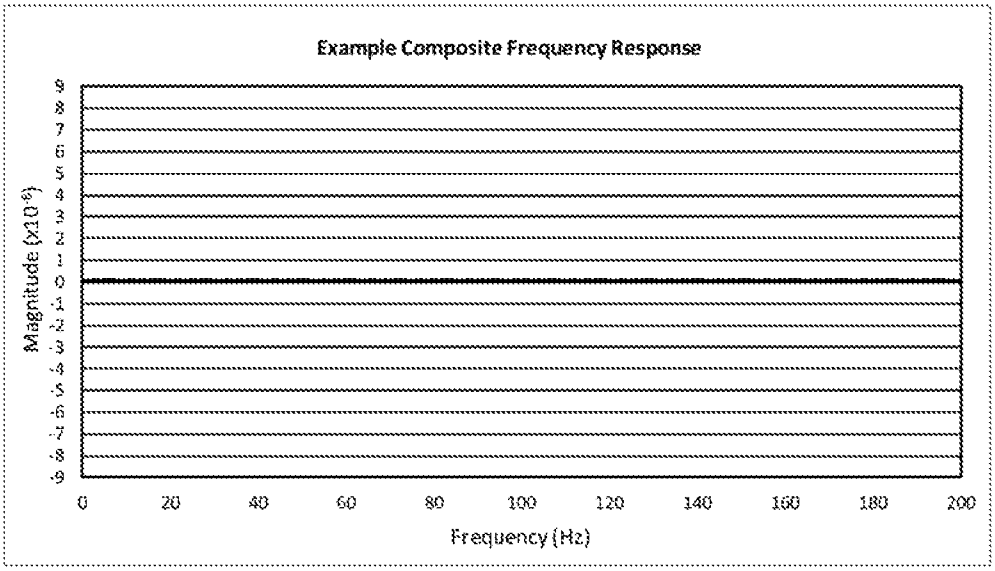
FIG. 4 depicts the combined frequency response of the loudspeaker and the filter as depicted in FIG. 3.

FIG. 3 depicts an example frequency response of the example loudspeaker of FIG. 2 coupled to the filter arrangement 104 described with reference to FIG. 1 (i.e., the loudspeaker generating the frequency response depicted in FIG. 3 may be included in a loudspeaker apparatus having the arrangement depicted in FIG. 1). As shown, the frequency response of the filter(s) 112 substantially mirrors the frequency response of the example loudspeaker apparatus 100 of FIG. 2, which may result in a composite frequency response that is substantially flat, as shown in FIG. 4. As used herein, “substantially flat” may mean flat or mostly flat with a minimal amount of noise such that resonance and/or ringing is reduced as compared to the sound generated without the suppression offered by the filtered audio input signal.

Referring again to FIG. 1, the filter(s) 112 of the filter arrangement 104 may comprise a digital filter or any digital filter technique suitable for suppressing a modal frequency of a flat loudspeaker. In some implementations, the filter(s) 112 may comprise at least one notch filter. A notch filter typically suppresses a specific frequency, typically called a “center frequency” or “stop band frequency.” If the audio input signal is pre-processed with a notch filter designed to suppress a modal frequency, then the resonance and/or ringing from that modal frequency will not occur. In some implementations, the filter(s) 112 may comprise a cascade of notch filters, each of the notch filters having a different center (or stop band) frequency for suppressing multiple corresponding modal frequencies. For example, in some implementations, the loudspeaker apparatus 100 may comprise a first notch filter to suppress a first modal frequency of the flat loudspeaker diaphragm 106 and a second notch filter to suppress a second modal frequency of the flat loudspeaker diaphragm 106. By using digital filters, it may be possible to suppress multiple modal frequencies without having to change any hardware configuration, including the number and the placement of actuator(s) 108, of the loudspeaker apparatus 100.

In various implementations, the filter(s) 112 of the filter arrangement 104 may comprise at least one inverse comb filter. A comb filter may be designed to boost harmonically related frequencies, typically by using feedback (IIR) or feed-forward (FIR) delay lines designed with poles at the frequencies to be boosted. In various implementations of the present disclosure, an inverse comb filter (ICF) may be designed by using zeroes instead of poles at the modal frequencies to be suppressed. The center frequencies of CF and ICF may be harmonically related, and thus, may be suitable to suppress modal frequencies that, are harmonically related. For example, an example frequency response of an ICF may be designed to suppress a 60 Hz center frequency and its harmonics (i.e., 120, 180, 240, and 300 Hz). For implementations in which some of the modal frequencies are not harmonically related, then the filter(s) 112 of the filter arrangement 104 may comprise at least one inverse comb filter and at least one notch filter. In some of these implementations, an inverse comb filter may suppress modal frequencies corresponding to the inverse comb filters center frequency or center frequency and at least one harmonic frequency, and a notch filter to suppress modal frequencies corresponding to the notch filters center frequency.

In other implementations, instead of a notch filter or inverse comb filter, the filter(s) 112 of the filter arrangement 104 may comprise a digital filter technique with arbitrary frequency responses. By using “inverse filtering” techniques, modal frequencies may be suppressed by measuring the frequency response of the flat loudspeaker diaphragm 106 and then designing an inverse filter for the measured frequency response.

Figure 5:
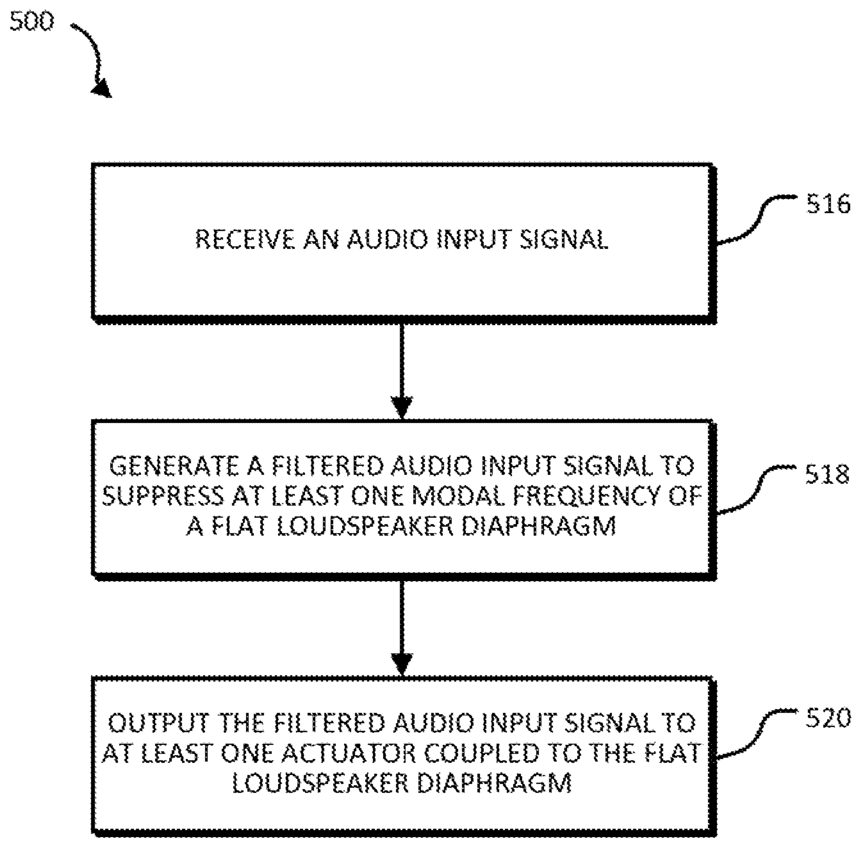
FIG. 5 is a flow diagram of a example method for suppressing a modal frequency response of a loudspeaker.

FIG. 5 is a flow diagram depicting an example method 500 for suppressing a modal frequency of a flat loudspeaker diaphragm, in accordance with the various implementations described herein. While the flow diagram illustrates various operations in a particular order, the drawing is not intended to limit the present disclosure to any particular order. Additionally, the drawing is not intended to imply that all operations are required for all implementations.

Processing for the method 500 may begin or proceed to, block 516 by receiving an audio input signal. The audio input signal may be received by an input port of a filter arrangement, or at least one filter of the filter arrangement, of a loudspeaker apparatus.

The method 500 may proceed to block 518 by generating, from the audio input signal, a filtered audio input signal to suppress at least one modal frequency of a flat loudspeaker diaphragm. In various implementations, generating the filtered audio input signal may be performed by at least one filter, such as, for example, an inverse comb filter, a notch filter, or a combination thereof, of the loudspeaker apparatus. In some of these implementations, generating the filtered audio input signal may comprise suppressing a first modal frequency of the flat loudspeaker diaphragm and suppressing a second modal frequency of the flat loudspeaker diaphragm In the same or different implementations, generating the filtered audio input signal may comprise suppressing a first modal frequency and at least one harmonic of the first modal frequency. In some implementations, generating the filtered audio input signal may be performed by a digital filtering technique described herein.

The method 500 may proceed to block 520 by outputting the filtered audio input signal to at least one actuator coupled to the flat loudspeaker diaphragm to cause a vibration of the flat loudspeaker diaphragm. As described herein the vibration of the flat loudspeaker diaphragm may have a substantially flat frequency response, with little or no resonance and/or ringing.

Although certain implementations have been illustrated and described herein, it will be appreciated by those of ordinary skill in the art that a wide variety of alternate and/or equivalent implementations calculated to achieve the same purposes may be substituted for the implementations shown and described without departing from the scope of this disclosure. Those with skill in the art will readily appreciate that implementations may be implemented in a wide variety of ways. This application is intended to cover any adaptations or variations of the implementations discussed herein. It is manifestly intended, therefore, that implementations be limited only by the claims and the equivalents thereof.

What is claimed is:

1. An apparatus comprising:
- a flat loudspeaker diaphragm having an associated modal frequency;
- at least one actuator coupled to the flat loudspeaker diaphragm; and
- a filter having a stop band frequency corresponding to the modal frequency of the flat loudspeaker diaphragm and pass band frequencies at lower and higher frequencies relative to the stop band frequency, wherein the filter receives an audio input signal, suppresses a content of the received audio input signal corresponding to the stop band frequency to produce a filtered audio input signal, and provide the filtered audio input signal to at least one actuator to cause a vibration of the flat loudspeaker diaphragm.

2. The apparatus of claim 1, wherein the vibration of the flat loudspeaker diaphragm has a substantially flat frequency response.

3. The apparatus of claim 1, wherein the at least one actuator comprises a plurality of actuators, each one of the plurality of actuators to cause a vibration of the flat loudspeaker diaphragm at a frequency range different from frequency ranges of other ones of the plurality of actuators.

4. The apparatus of claim 1, wherein the filter includes a digital filter.

5. The apparatus of claim 1, wherein the filter includes at least one notch filter having a center frequency corresponding to the modal frequency.

6. The apparatus of claim 5, wherein the at least one notch filter comprises a cascade of a plurality of notch filters.

7. The apparatus of claim 1, wherein the filter includes an inverse comb filter.

8. The apparatus of claim 1, wherein the filter includes at least one notch filter and at least one inverse comb filter.

9. The apparatus of claim 1, wherein the filter has a frequency response that substantially mirrors a frequency response of the flat loudspeaker diaphragm.

10. The apparatus of claim 1, wherein the modal frequency of the flat loudspeaker diaphragm corresponds to a vibrational mode of the diaphragm.

11. The apparatus of claim 1, wherein the filter has a frequency response comprising a notch corresponding to the modal frequency.

12. An apparatus comprising:
- an input port to receive an audio input signal;
- a filter comprising a stop band frequency corresponding to a modal frequency of a flat loud speaker diaphragm and pass band frequencies at lower and higher frequencies relative to the stop band frequency, wherein the filter receives the audio input signal, filters the received audio input signal to suppress a content of the received audio input signal corresponding to the modal frequency to produce a filtered audio input signal; and
- an output port to output the filtered audio input signal to at least one actuator coupled to the flat loudspeaker diaphragm to cause a vibration of the flat loudspeaker diaphragm.

13. The apparatus of claim 12, wherein the filter comprises at least one of a notch filter, an inverse comb filter, and an inverse filter.

14. The apparatus of claim 12, wherein the filter has another stop band frequency corresponding to another modal frequency of the flat loudspeaker diaphragm.

15. The apparatus of claim 12, wherein the modal frequency corresponds to a vibrational mode of the diaphragm.

16. A method comprising:
- receiving an audio input signal;
- filtering the received audio input signal with a notch filter having a stop band frequency corresponding to a first modal frequency of a flat loudspeaker diaphragm to suppress a content of the received audio input signal corresponding to the first modal frequency to produce a filtered audio input signal; and
- outputting the filtered audio input signal to at least one actuator coupled to the flat loudspeaker diaphragm to cause a vibration of the flat loudspeaker diaphragm.

17. The method of claim 16, wherein the filtering further comprises suppressing a second-modal frequency of the flat loudspeaker diaphragm.

18. The method of claim 16, wherein the filtering further comprises suppressing at least one harmonic of the first modal frequency.

19. The method of claim 16, wherein the first modal frequency corresponds to a vibrational mode of the flat loudspeaker diaphragm.

* * * * *